(12) United States Patent
Tsotsis et al.

(10) Patent No.: US 10,787,591 B2
(45) Date of Patent: Sep. 29, 2020

(54) COMPOSITES INCLUDING SILICON-OXY-CARBIDE LAYERS AND METHODS OF MAKING THE SAME

(71) Applicant: The Boeing Company, Chicago, IL (US)

(72) Inventors: Thomas K. Tsotsis, Santa Ana, CA (US); Marvi A. Matos, Seattle, WA (US); Alpana Ranade, Bellevue, WA (US); Laura M. Murphy, Bothell, WA (US)

(73) Assignee: THE BOEING COMPANY, Chicago, IL (US)

( * ) Notice: Subject to any disclaimer, the term of this patent is extended or adjusted under 35 U.S.C. 154(b) by 1008 days.

(21) Appl. No.: 13/833,686

(22) Filed: Mar. 15, 2013

(65) Prior Publication Data

US 2013/0288044 A1    Oct. 31, 2013

Related U.S. Application Data

(60) Provisional application No. 61/640,293, filed on Apr. 30, 2012.

(51) Int. Cl.
*C09D 179/08* (2006.01)
*C23C 16/30* (2006.01)
*C23C 16/453* (2006.01)

(52) U.S. Cl.
CPC ............ *C09D 179/08* (2013.01); *C23C 16/30* (2013.01); *C23C 16/453* (2013.01); *Y10T 428/265* (2015.01)

(58) Field of Classification Search
None
See application file for complete search history.

(56) References Cited

U.S. PATENT DOCUMENTS

| 3,745,149 A | 7/1973 | Serafini et al. |
| 5,081,198 A | 1/1992 | Pater |
| 5,171,822 A | 12/1992 | Pater |
| 5,338,827 A | 8/1994 | Serafini et al. |
| 5,412,066 A | 5/1995 | Hergenrother et al. |
| 5,654,396 A | 8/1997 | Lubowitz et al. |

(Continued)

FOREIGN PATENT DOCUMENTS

| CA | 2380971 C | * 12/2009 | ............ B29C 55/14 |
| JP | 2005-537963 A | 12/2005 | |

(Continued)

OTHER PUBLICATIONS

English machine translation from JPO for JP 2010158832 (2010).*

(Continued)

*Primary Examiner* — Kenneth J Stachel
(74) *Attorney, Agent, or Firm* — Alston & Bird LLP

(57) ABSTRACT

Composites comprising at least one silicon-oxy-carbide (SOC) layer deposited onto a polymeric matrix substrate to enhance their thermo-oxidative stability are provided. The SOC layer is formed onto the polymeric matrix substrate by atmospheric plasma deposition to produce an thermo-oxidative barrier coating or an adhesion-promoting layer to enable the deposition of a variety of known (or future developed) metallic and/or ceramic materials as oxygen and/or thermal barriers.

16 Claims, 14 Drawing Sheets

(56) References Cited

U.S. PATENT DOCUMENTS

| | | | |
|---|---|---|---|
| 5,826,366 A * | 10/1998 | Matibe | A01K 87/007 43/17.5 |
| 5,853,877 A * | 12/1998 | Shibuta | B82Y 30/00 428/357 |
| 5,939,521 A * | 8/1999 | Chuang | C07C 205/38 528/125 |
| 6,124,035 A | 9/2000 | Connell et al. | |
| 6,194,036 B1 | 2/2001 | Babayan et al. | |
| 6,214,451 B1 * | 4/2001 | Ihira | C08K 7/06 428/220 |
| 6,949,830 B2 | 9/2005 | Owada et al. | |
| 6,958,192 B2 | 10/2005 | Hergenrother et al. | |
| 7,041,778 B1 | 5/2006 | Curliss et al. | |
| 7,776,404 B2 | 8/2010 | Ronk et al. | |
| 7,776,433 B2 | 8/2010 | Ronk et al. | |
| 7,776,434 B2 | 8/2010 | Whiteker et al. | |
| 2004/0046497 A1 | 3/2004 | Schaepkens et al. | |
| 2004/0180210 A1 * | 9/2004 | Vissing | B05D 1/62 428/421 |
| 2005/0137383 A1 * | 6/2005 | Connell | C08G 73/10 528/353 |
| 2006/0001040 A1 | 5/2006 | Kim et al. | |
| 2007/0196633 A1 | 8/2007 | Coak et al. | |
| 2008/0051548 A1 * | 2/2008 | Bailey | C08J 5/04 528/31 |
| 2008/0206575 A1 | 8/2008 | Ronk et al. | |
| 2008/0213486 A1 | 9/2008 | Ronk et al. | |
| 2008/0213604 A1 | 9/2008 | Whiteker et al. | |
| 2008/0241506 A1 * | 10/2008 | McCormick | C23C 14/08 428/317.3 |
| 2008/0284971 A1 * | 11/2008 | Park | G02F 1/133305 349/158 |
| 2008/0318067 A1 * | 12/2008 | Itoh | C08J 5/18 428/447 |
| 2009/0202817 A1 * | 8/2009 | Durandeau | B05D 1/62 428/332 |
| 2009/0221778 A1 * | 9/2009 | Muramatsu | C09D 183/04 526/279 |
| 2010/0092781 A1 * | 4/2010 | Zambov | C23C 16/30 428/412 |
| 2010/0279027 A1 | 11/2010 | Pingree et al. | |
| 2012/0035057 A1 * | 2/2012 | Bratkovski | H01L 39/005 505/160 |

FOREIGN PATENT DOCUMENTS

| | | | |
|---|---|---|---|
| JP | 2006123306 A * | 5/2006 | |
| JP | 2008-520477 A | 6/2008 | |
| JP | 2009-511290 A | 3/2009 | |
| JP | 2009-539754 A | 11/2009 | |
| JP | 2010158832 A * | 7/2010 | |
| WO | WO 97/38850 A1 | 10/1997 | |
| WO | WO 2004/025749 A2 | 3/2004 | |
| WO | WO 2007/044181 A2 | 4/2007 | |
| WO | WO 2007/089218 A2 | 8/2007 | |
| WO | WO 2008/137588 A1 | 11/2008 | |
| WO | WO 2010/129149 A1 | 11/2010 | |

OTHER PUBLICATIONS

CAS Registry No. 39345-87-4 SciFinder (ACS) 2016.*
Reinforcement, Polymer Encyclopedia.*
English machine translation of 2006123306 JPO (2006).*
Oxidation Protective Barrier Coatings for Hi-T PMC, David Harding, J. Mater. Res., vol. 9, No. 6, Jun. 1994.*
CAS RN 78392-33-3PMR-15 polyimide SciFinder (2017).*
Derwent Acc-No. 1993-309256 (1993).*
International Search Report and Written Opinion for Application No. PCT/US2013/034435 dated Jan. 21, 2014.
Office Action for Japanese Patent Application No. 2015-510287 dated Apr. 4, 2017.
Office Action for European Patent Application No. 13 783 121.0 dated Mar. 31, 2017.
Tsotsis, T.K.; "Thermo-Oxidative Ageing in Composites"; Ageing of Composites; Woodhead Publishing, Ltd., Cambridge, UK, Jan. 2008, p. 130-159.
Office Action for Japanese Patent Application No. 2015-510287 dated Oct. 31, 2017, 8 pages.
Schafer, Jan et al.; "Complex analysis of SiOxCyHz films deposited by an atmospheric pressure dielectric barrier discharge"; Surface and Coatings Technology; vol. 205, Jul. 1, 2011; pp. S330-S334; XP055419593.
Starostin S. et al.; "High current diffuse dielectric barrier discharge in atmospheric pressure air for the deposition of thin silica-like films"; Applied Physics Letters; vol. 96, No. 6; Feb. 9, 2010; pp. 61502-61502; XP012132113.
Starostine S. et al.; "Atmospheric pressure barrier discharge deposition of silica-like films on polymeric substrates"; Plasma Processes and Polymers; vol. 4, No. S1; Apr. 1, 2007; pp. S440-S444; XP055130721.
Summons to Attend Oral Proceedings from corresponding European Patent Application No. 13 783 121.0 dated Nov. 22, 2017, 6 pages.
Office Action for Japanese Application No. 2015-510287 dated May 8, 2018.
Office Action for Japanese Application No. 2018-159930 dated Jun. 18, 2019, 5 pages.

* cited by examiner

COMPOSITES INCLUDING SILICON-OXY-CARBIDE LAYERS AND METHODS OF MAKING THE SAME

CROSS-REFERENCED TO RELATED APPLICATIONS

This application claims the benefit of U.S. Provisional Application No. 61/640,293, filed Apr. 30, 2012, the entire contents of which are incorporated herein by reference.

TECHNICAL FIELD

The presently disclosed subject matter relates to high-temperature polymer composites including at least one silicon-oxy-carbide film deposited by atmospheric plasma deposition.

BACKGROUND

The use of high-temperature polymeric materials can be limited at elevated temperatures (e.g., greater than about 350° F.) in applications that require long exposures (e.g., greater than 1000 hours) because the polymeric materials may react with oxygen under these conditions. This interaction of the polymeric materials with oxygen can result in undesirable degradation and diminishing material properties that can be difficult to predict.

As referenced above, the effects of thermal or thermally activated degradation typically only become apparent after long periods of time due to the physical and chemical processes involved. During matrix degradation, several processes occur simultaneously: diffusion of oxygen into the matrix, diffusion of degradation products out of the matrix, reaction of oxygen with the matrix, thermal-degradation reactions within the matrix, reaction of degradation and oxidation byproducts with the matrix, with each other, and with oxygen. A schematic of this process is shown in FIG. 1.

After significant amounts of time, the degradation may create even greater degradation than that illustrated by FIG. 1 and may start to wear-away some of the composite surface layers. FIG. 2 shows a depiction of such increased surface degredation.

Intuitively it would seem that protecting a material's surface from oxygen diffusion would improve its thermo-oxidative stability and, indeed, some studies verify this supposition. In one such study, aluminum foil was used to coat Celion 6000/PMR-15 composites and did find that a thin coating did provide significant protection from oxidation. In another study, the use of an expanded graphite barrier reduced the rate of oxidative degradation of PMR-15 resin such that the thermo-oxidative stability increased by up to 25%.

Accordingly, there still remains a need for high-temperature barrier coatings (e.g., oxygen-barrier) as well as adhesion-promoting coatings (e.g., interlayers) to enable the deposition of oxygen and/or thermal barriers onto a polymeric substrate for high-temperature polymeric materials.

BRIEF SUMMARY

One or more aspects of the present disclosure may address one or more of the aforementioned problems. Certain aspects according to the present disclosure provide composites including a polymeric matrix substrate and a thermo-oxidative barrier coating. The thermo-oxidative coating comprises a silicon-oxy-carbide (SOC) layer generally having a thickness from about 50 nm to about 12 microns and covering at least one surface of the polymeric substrate. Beneficially, the SOC layer is formed by atmospheric plasma deposition. As such, the SOC layer can be tailored for specific polymeric matrix substrates and/or specific applications for the composite. Other technologies to create barrier layers (e.g., oxygen-barrier layers) are not easily tailorable and cannot achieve the high level of process control realized by the deposition of a SOC layer according to aspects of the present disclosure. Certain aspects provide composites that beneficially demonstrate an increased level of thermo-oxidative stability relative of composites of the same polymeric substrate being devoid of a thermo-oxidative barrier coating according to aspects of the present disclosure.

In other aspects, the present disclosure provides composites including an adhesion-promoting layer comprising a silicon-oxy-carbide (SOC) layer having a thickness generally from about 50 nm to about 12 microns deposited onto at least one surface of a polymeric matrix substrate. Beneficially, the SOC layer is formed by atmospheric plasma deposition. The adhesion-promoting layer can be used to bind a known (or prospective) oxygen-barrier layer (OBL) onto the composite. That is, the OBL can be deposited in a manner substantially (or fully) overlying the adhesion-promoting layer such that the adhesion-promoting layer is sandwiched between the polymeric matrix substrate and the OBL. In this regard, the adhesion-promoting layer functions at least in one respect as a tailorable tie-layer for the polymeric matrix substrate and the OBL. Beneficially, for instance, the adhesion-promoting layer increases the degree to which the OBL is attached to the composite. For example, the adhesion-promoting layer according to aspects of the present disclosure can increase the bond strength of the OBL to the polymeric substrate relative to the bond strength of the same OBL directly deposited onto the same polymeric substrate.

In another aspect, the present disclosure provides for methods of making composites according to aspects of the present disclosure. According to certain aspects, methods of forming a composite include a step of depositing a thermo-oxidative barrier coating comprising a SOC layer, preferably having a thickness from about 50 nm to about 12 microns, onto at least one surface of a polymeric matrix substrate via atmospheric plasma deposition. The thermo-oxidative barrier coating beneficially reduces the level and/or rate of oxygen diffusion into the polymeric matrix resin. Consequently, certain aspects of the present disclosure demonstrate an increased level of thermo-oxidative stability relative of composites of the same polymeric substrate being devoid of a thermo-oxidative barrier coating according to aspects of the present disclosure.

In certain methods according to aspects of the present disclosure, composites are produced by depositing an adhesion-promoting layer comprising a SOC, preferably having a thickness from about 50 nm to about 12 microns, onto at least one surface of a polymeric matrix substrate followed by depositing an OBL substantially overlying the adhesion-promoting layer. The adhesion-promoting layer, in at least one respect, functions as a tie-layer to facilitate a stronger and longer-lasting bond of the OBL to the polymeric matrix substrate. In certain aspects, for instance, the adhesion-promoting layer can be specifically tailored to tie dissimilar materials (e.g., the OBL layer being dissimilar to the polymeric matrix substrate as realized by a relatively weak or non-existent direct bond between the two components).

Beneficially, the SOC layer is formed by atmospheric plasma deposition, which enables a high level of tailoring for specific polymeric matrix substrates, OBL, and/or specific applications for the resulting composite.

BRIEF DESCRIPTION OF THE SEVERAL VIEWS OF THE DRAWING(S)

Having thus described aspects of the disclosure in general terms, reference will now be made to the accompanying drawings, which are not necessarily to scale, and wherein:

Figure 7A:
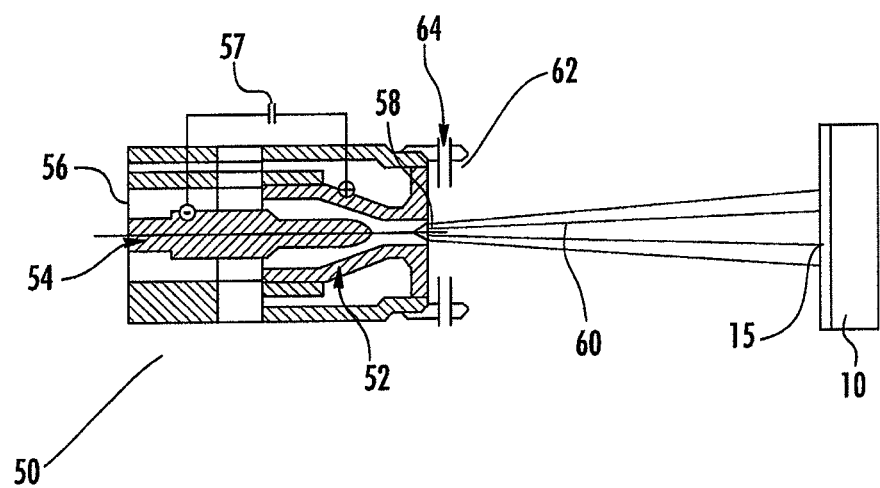
Figure 7B:
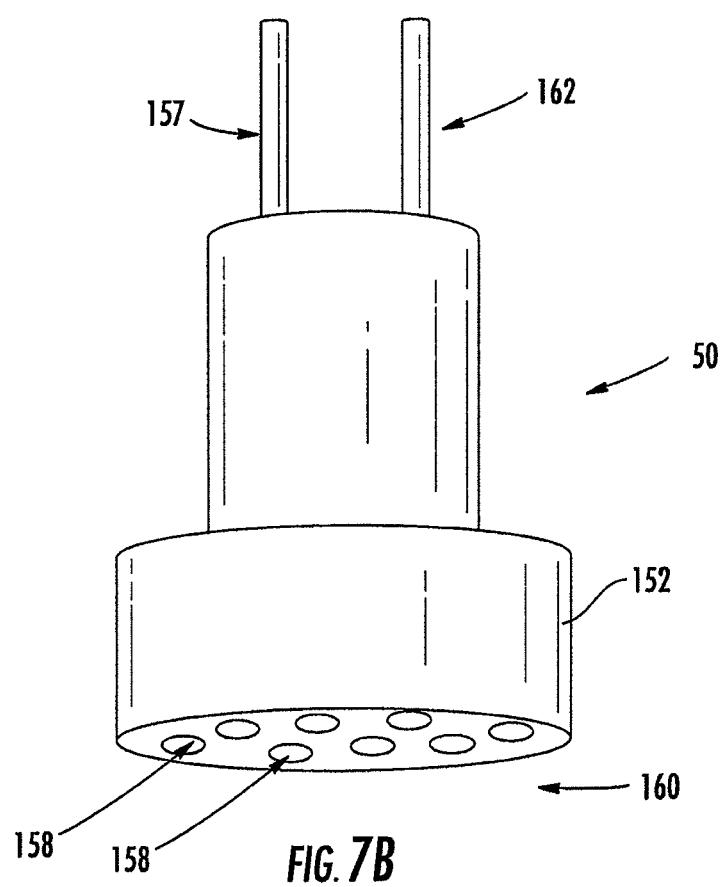

FIG. 7A provides a general schematic of atmospheric plasma deposition that can be employed in forming SOC coating aspects;

FIG. 7B provides a general schematic of an atmospheric plasma deposition device including a showerhead-type discharge head aspect;

FIGS. 8A-8I are Fourier transform infrared spectroscopy (FTIR) spectra for SOC layers (i) prior to aging, (ii) after about 3432 hours of aging, and (iii) after about 7752 hours of aging.

DETAILED DESCRIPTION

The present disclosure now will be described more fully hereinafter with reference to the accompanying drawings, in which some, but not all aspects of the disclosures are shown. Indeed, this disclosure can be embodied in many different forms and should not be construed as limited to the aspects set forth herein; rather, these aspects are provided so that this disclosure will satisfy applicable legal requirements. As used in the specification, and in the appended claims, the singular forms "a", "an", "the", include plural referents unless the context clearly dictates otherwise.

Silicon-oxy-carbides (SOC) include Si—O—C as their main skeleton. Aspects of the present disclosure comprise high-temperature polymer composites including at least one SOC coating or layer deposited onto a polymeric matrix substrate by atmospheric plasma deposition as well as systems and methods of applying SOC layers on polymeric matrix substrates to form composites demonstrating an improved level of thermo-oxidative stability. The use of atmospheric plasma deposition beneficially enables the tailoring of the resulting SOC layers so that they can function either (or both) (i) as a thermo-oxidative barrier coating preventing or significantly mitigating the level of oxygen that diffuses into the polymeric matrix substrate or (ii) an adhesion-promoting layer increasing the degree of adherence or bonding of an oxygen-barrier layer (OBL) to the polymeric matrix substrate. Additional benefits of using atmospheric plasma deposition include the ability to provide uniform coatings, particularly on complex and/or contoured surfaces, and a lower cost of capital equipment than traditional thin film vacuum deposition methods. In certain aspects, a composite can include a SOC layer sandwiched between the polymeric matrix substrate and a commercially known or viable OBL in which the SOC layer functions both as a "tie-layer" to attach two dissimilar components (e.g., substrate and OBL) and also as a secondary oxygen-barrier to prevent oxygen diffusion into the polymeric matrix substrate.

The SOC layers, whether tailored and deposited as a thermo-oxidative barrier, adhesion-promoting layer, or both, are preferably capable of withstanding high-temperature (e.g., 350-700° F.) exposures that are either non-porous, strain-resistant, or a combination thereof. The SOC layers, according to aspects of the present disclosure, can beneficially enhance a composite's thermo-oxidative stability. Composites including one or more SOC layers according to certain aspects of the present disclosure exhibit a substantially reduced level of oxygen diffusion into the polymeric matrix substrate. That is, the one or more SOC layers significantly retard thermo-oxidative degradation. In this regard, the one or more SOC layers prevents or substantially reduces the level of oxygen diffusing into the polymeric matrix substrate.

As noted above, the SOC layers can be deposited onto the polymeric matrix substrate utilizing atmospheric plasma deposition. Utilization of atmospheric plasma deposition enables the creation of tailorable, thermo-oxidative stable, strain-resistant coatings to improve the in-service durability and useful service temperature of high-temperature polymeric composites. With regard to tailorability, the use of atmospheric plasma deposition enables the formation of a dense and durable thin film or coating directly onto substrates and to complex (e.g., contoured) shapes as compared to other approaches. Furthermore, certain aspects of the present disclosure enable the use of high-performance materials to produce durable, non-permeable, strain-resistant oxygen-barriers or adhesion-promoting layers. In addition, aspects of the present disclosure provide for the formation of tailored coatings below the micron scale to obtain desired features. A further advantage of aspects of the present disclosure lies in the ability to directly apply an SOC coating to complex shapes to form composite of such complex shapes. In certain aspects, atmospheric plasma deposition can be provided as a mobile system so that coatings can be applied on site rather than in a lab or factory, if so desired.

SOC coatings according to aspects of the present disclosure can comprise a thickness of at least any of the following: 10, 50, 100, 200, 300, 400, and 500 nm; and at most about any of the following: 12000, 10000, 50000, 1000, 900, 800, 700, 600, 500, and 400 nm (e.g., 10-12000 nm, 10-10000 nm, 50-800 nm, 50-500 nm, 10-200 nm, etc.). For instance, SOC coatings according to certain aspects of the present disclosure can comprise a thickness from about 50 nm to about 12 microns.

The respective carbon, silicon, and oxygen content of SOC coatings according to certain aspects of the present disclosure can be varied in view of a particularly intended application. For instance, the SOC layers can include a carbon content comprising at least any of the following: 3, 5, 10, 20, 30, 40, 50, and 60%; and at most about any of the following: 70, 60, 50, 40, 30, 25%, 20%, ands 10% (e.g., 5-70%, 20-70%, 10-40%, 50-70%, 3-50%, 3-25%, 3-10%, etc.).

Similarly, the SOC coatings can include a silicon content comprising at least any of the following: 3, 5, 10, 20, 30, 40, 50, and 60%; and at most about any of the following: 70, 60, 50, 40, 30, 25%, 20%, ands 10% (e.g., 5-70%, 20-70%, 10-40%, 50-70%, 3-50%, 3-25%, 3-10%, etc.).

Likewise, the SOC coatings can include an oxygen content comprising at least any of the following: 3, 5, 10, 20, 30, 40, 50, and 60%; and at most about any of the following: 70, 60, 50, 40, 30, 25%, 20%, ands 10% (e.g., 5-70%, 20-70%, 10-40%, 50-70%, 3-50%, 3-25%, 3-10%, etc.).

As noted above, the SOC coating or layers according to aspects of the present disclosure are created via atmospheric plasma deposition. A variety of chemical precursors can be used in atmospheric plasma deposition for creating SOC layers according to aspects of the present disclosure. For example, a wide variety of siloxanes and organosilanes can be employed in certain aspects. A few exemplary chemical precursors can include octamethylcyclotetrasiloxane (OMCTS), tetramethylcyclotetrasiloxane (TMCTS), hexamethyldisiloxane (HMDSO), 1,2-bis(triethoxysilyl)ethane (BTESE), tetraethyl orthosilicate (TEOS), hexamethyldisilizane (HMDSN), tetrarnethyldisiloxane (TMDSO), or combinations thereof.

Due at least in part to the tailorability of creating specific SOC layers by utilizing atmospheric plasma deposition, a wide variety of polymeric resin substrates can be employed according to aspects of the present disclosure. In this regard, the particular chemistry of the polymeric matrix substrate is generally not limited. For example, the polymeric matrix substrate can comprise a polyimide, a bismaleimide, a benzoxazine, a thermoplastic (e.g., a polyetheretherketone, polyetherketoneketone, etc.), an epoxy, a cyanate ester, or combinations thereof.

In certain aspects, the polymeric matrix substrate comprises a polyimide, preferably a polyimide recognized as being suitable for high-performance and/or high-temperature applications. More specifically, examples of polyimides suitable for composite fabrication according to certain aspects of the present disclosure include those disclosed in U.S. Pat. No. 3,745,149 (Serafini et al.), U.S. Pat. No. 5,338,827 (Serafini et al.), U.S. Pat. No. 5,171,822 (Pater), U.S. Pat. No. 5,081,198 (Pater et al.), U.S. Pat. No. 7,041,778 (Curliss et al.), U.S. Pat. No. 6,958,192 (Hergenrother et al.), U.S. Pat. No. 5,412,066 (Hergenrother et al.), U.S. Pat. No. 6,124,035 (Hergenrother et al.), and U.S. Pat. No. 5,654,396 (Lubowitz et al.), the contents of each are hereby incorporated in their entireties by reference. A few preferred specific examples of such polyimide matrix resins include PMR-15 (described in U.S. Pat. No. 3,745,149), PMR-II-50, RP-46, phenylethynyl end-capped polyimides such as PETI-5 and PETI-330, HFPE-52-II, and AFR-PE-4, the contents of each are hereby incorporated in their entireties by reference.

Embodiments of the disclosure are directed to fiber reinforced polymer matrixes. U.S. Pat. No. 3,745,149 describes a composite comprising graphite fibers impregnated with a polyimide resin. U.S. Pat. No. 5,338,827 describes polyimide resins reinforced with fibers, such as carbon fibers including graphite, ceramics, including glass, quartz, alumina, silica, and silicon carbide. U.S. Pat. No. 5,171,822 describes graphite fiber reinforced PMR polyimide composites. U.S. Pat. No. 5,081,198 describes graphite fiber reinforced polyimide composites in which multiple plies of prepreg are stacked unidirectionally and then cured. U.S. Pat. No. 5,654,396 describes prepregs, and composites prepared therefrom, in which polyimide oligomers are reinforced with woven fabrics having fibers that may be continuous or discontinuous, and may be ceramic, organic, carbon (graphite), or glass.

In certain aspects, the present disclosure provides composites comprising a polymeric matrix substrate and a thermo-oxidative barrier coating. The thermo-oxidative coating comprises a SOC layer created by atmospheric plasma deposition. Preferably, the SOC layer has a thickness from about 100 to about 900 nm and covers at least one surface of the polymeric substrate. The SOC layer beneficially can reduce (or virtually eliminate) the amount of oxygen that diffuses into the polymeric matrix substrate.

Resistance to oxygen penetration can be measured via oxygen diffusivity measurements on SOC coatings according to aspects of the present disclosure. Polymeric matrix substrates coated with an SOC layer in accordance with aspects of the present disclosure can be exposed to thermo-oxidative environments for evaluation of thermal protection. For example, a thermo-oxidative stability test can include placing samples (e.g., SOC-coated polymeric matrix substrates) in a chamber through which a constant flow of air travels at a rate sufficient to refresh the chamber volume at a rate of 5 times/hour. The test temperature, pressure, and time can be selected to result in a measurable degradation of an unprotected (uncoated) polymeric matrix substrate for direct comparison. The oxygen-barrier capability of the SOC coating can be determined by the weight loss of protected composite samples relative to unprotected composite samples.

Thermo-oxidative Stability (TOS) is the ability of the composite to withstand elevated temperatures in an oxygen-containing environment, such as air, with minimal loss of weight and/or properties. Since, in a composite, compression strength is a resin-dominated property, the retention of compression strength after long-time exposures to high temperatures is monitored as a measure of TOS. Weight loss over time can also be used as a measure. Polymers can degrade through mechanisms, such as volatilization, resulting in a composite having reduced mass due to this loss of polymer. One test used herein to measure TOS includes placing a plaque of polymeric or composite material in a chamber, increasing the temperature and pressure within the chamber to a predetermined temperature and pressure, and holding these conditions for up to several thousand hours with multiple atmospheric changes over the course of the test. The plaques are then removed and tested for weight loss and retention of compression and/or shear strength. The weight loss and retention of compression strength reflect service conditions in high-performance environments and provide a measure of the longer-term stability of the polymeric material. A higher TOS is important for material that will be used at a high temperature in air for long periods of time.

Composites, in accordance with certain aspects of the present disclosure, can comprise a TOS comprising less than at least any of the following: 10%, 7%, 5%, 4%, 3%, 2%, 1%, 0.5%, 0.1%, and 0% weight loss (e.g., 0.1-10%, 0.1-7%, etc.) relative to a composite comprising the same polymeric substrate and being devoid of a thermo-oxidative barrier layer comprising an SOC layer in accordance with aspects of the present disclosure.

Figure 1:
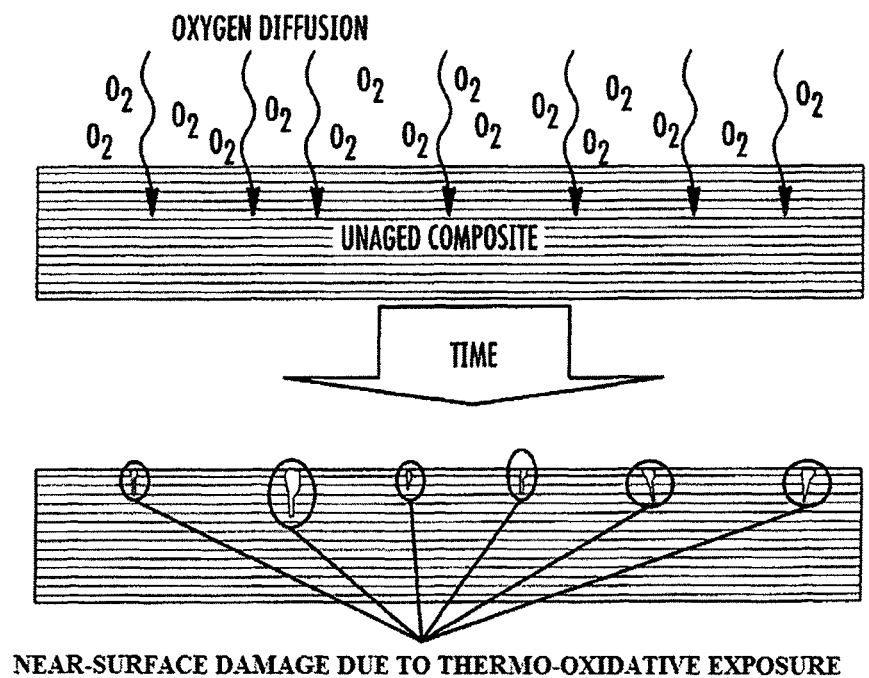
FIG. 1 shows a schematic of oxygen diffusion into a composite and resulting near-surface degradation after long-term, thermo-oxidative exposure.
Figure 2:
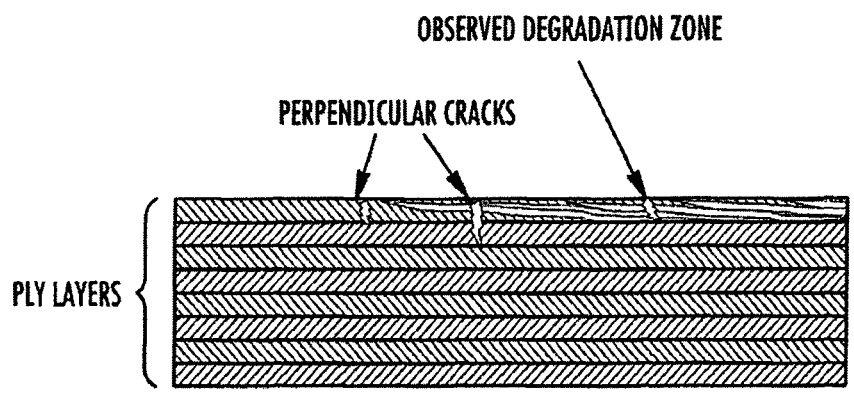
FIG. 2 shows a schematic of surface degradation due to thermo-oxidative aging.
Figure 3:
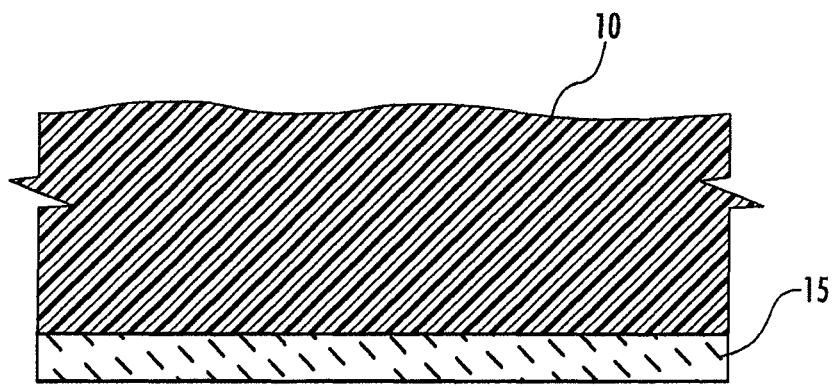
FIG. 3 illustrates a composite aspect comprising a thermo-oxidative barrier coating comprising a silicon-oxy-carbide (SOC) layer deposited onto a polymeric matrix substrate.

FIG. 3 illustrates a composite according to one aspect of the present disclosure comprising a thermo-oxidative barrier coating 15 comprising a SOC layer deposited onto a polymeric matrix substrate 10.

In another aspect, the present disclosure provides composites including an adhesion-promoting layer comprising a SOC layer deposited via atmospheric plasma deposition onto at least one surface of a polymeric matrix substrate. The adhesion-promoting layer can be used to bind a known (or prospective) oxygen-barrier layer (OBL) onto the composite. That is, the OBL can be deposited in a manner substantially (or fully) overlying the adhesion-promoting layer such that the adhesion-promoting layer is sandwiched between the polymeric matrix substrate and the OBL. In this regard, the adhesion-promoting layer functions at least in one respect as a tailorable tie-layer for the polymeric matrix substrate and the OBL. Beneficially, for instance, the adhesion-promoting layer increases the degree to which the OBL is attached to the composite. For example, the adhesion-promoting layer according to aspects of the present disclosure can increase the bond strength of the OBL to the polymeric substrate relative to the bond strength of the same OBL directly deposited onto the same polymeric substrate.

The OBL can include currently known (or OBL materials developed in the future) OBL materials that reduce (or virtually eliminates) oxygen diffusion into the polymeric matrix substrate. In general, OBL materials can comprise metallic materials, ceramic materials, or combinations thereof. Exemplary materials that may be used to form the OBL layer can include known oxygen-barriers such as silicon oxides, aluminum, and aluminum oxides.

In accordance to certain aspects of the present disclosure, the adhesion-promoting layer increases the bond strength of the OBL to the polymeric substrate relative to the bond strength of the same OBL directly deposited onto the same polymeric substrate. For instance, composites can comprise a first bond strength between the polymeric substrate and the SOC layer and a second bond strength between the SOC layer and the OBL. The first and second bond strengths each being greater than that of a comparative bond strength directly between the same OBL and the same polymeric substrate. As such, the incorporation of the adhesion-promoting layer helps ensure that an OBL material stays attached to the polymeric matrix substrate to improve the thermo-oxidative stability of the composite.

In certain aspects, for example, a composite can include a SOC layer sandwiched between the polymeric matrix substrate and a commercially known or viable OBL in which the SOC layer functions both as a "tie-layer" to attach two dissimilar components (e.g., substrate and OBL) and also as a secondary oxygen-barrier to prevent oxygen diffusion into the polymeric matrix substrate.

Figure 4:
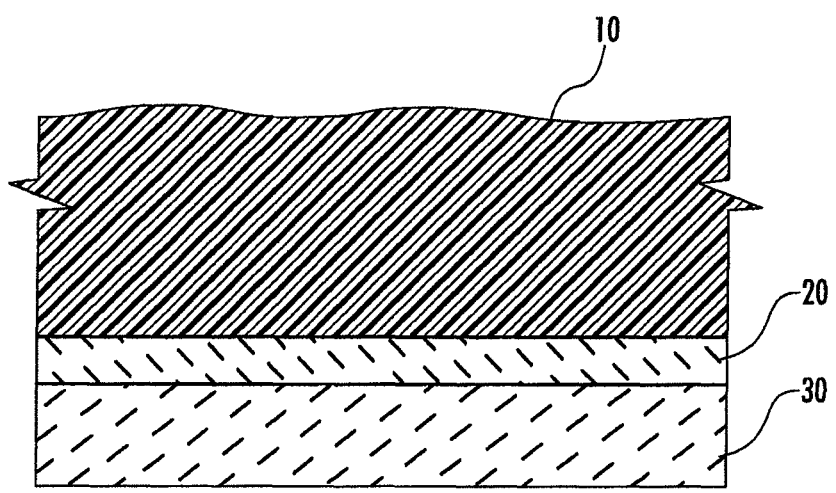
FIG. 4 illustrates a composite aspect comprising an adhesion-promoting layer comprising a silicon-oxy-carbide (SOC) layer sandwiched between at least one surface of a polymeric matrix substrate and an oxygen-barrier layer.

FIG. 4 illustrates a composite according to one aspect of the present disclosure comprising an adhesion-promoting layer 20 comprising a SOC layer deposited onto at least one surface of a polymeric matrix substrate 10. The adhesion-promoting layer 20 is sandwiched between at least one surface of a polymeric matrix substrate 10 and an OBL 30.

In another aspect, the present disclosure provides methods of fabricating composites according to aspects of the present disclosure. According to certain aspects, methods of forming composites include a step of depositing a thermo-oxidative barrier coating comprising a SOC layer directly onto at least one surface of a polymeric matrix substrate via atmospheric plasma deposition. The thermo-oxidative barrier coating beneficially reduces the level and/or rate of oxygen diffusion into the polymeric matrix resin. Consequently, certain aspects of the present disclosure demonstrate an increased level of thermo-oxidative stability relative of composites of the same polymeric substrate being devoid of a thermo-oxidative barrier coating according to aspects of the present disclosure.

Figure 5:
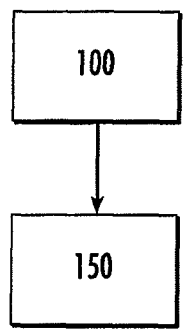
FIG. 5 illustrates a general flow diagram for a method of forming a composite aspect in which an SOC layer is provided as an oxygen-barrier layer (OBL)

As shown in FIG. 5, for instance, certain aspects of the present disclosure can include a step of providing one or more polymeric substrates 100 followed by depositing a thermo-oxidative barrier coating comprising a SOC layer 150 directly onto at least one surface of the polymeric substrate to provide a composite. Although not shown in FIG. 5, the polymeric substrates can be pre-cleaned by traditional physical or chemical methods and/or plasma pretreated prior to depositing an SOC layer onto the polymeric substrate. In accordance with aspects illustrated by FIG. 5, the SOC layer can provide adequate thermo-oxidative stability to the resulting composite that a traditionally employed thermo-oxidative barrier layer can be avoided if desired.

In certain methods according to aspects of the present disclosure, composites are produced by depositing an adhesion-promoting layer comprising a SOC onto at least one surface of a polymeric matrix substrate followed by depositing an OBL substantially overlying the adhesion-promoting layer. The adhesion-promoting layer, in at least one respect, functions as a tie-layer to facilitate a stronger and longer-lasting bond of the OBL to the polymeric matrix substrate. In certain aspects, for instance, the adhesion-promoting layer can be specifically tailored to tie dissimilar materials (e.g., the OBL layer being dissimilar to the polymeric matrix substrate as realized by a relatively weak or non-existent direct bond between the two components). Beneficially, the SOC layer is formed by atmospheric plasma deposition, which enables a high level of tailoring for specific polymeric matrix substrates, OBL, and/or specific applications for the resulting composite. The OBL reduces oxygen diffusion into the polymeric substrate and can comprise known OBL materials such as various metallic materials, ceramic materials, or combinations thereof. The OBL can be deposited on top (e.g., overlying) the adhesion-promoting layer by any technique known for depositing such materials.

The adhesion-promoting layer beneficially increases the bond strength of the OBL to the polymeric matrix substrate relative to the bond strength of the same OBL when directly deposited onto the same polymeric substrate. In this regard, the SOC layer functions as an interlayer over which a different layer (e.g., a traditional OBL) can be deposited.

Figure 6:
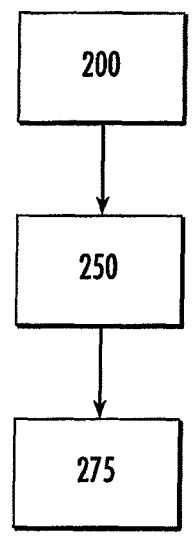
FIG. 6 illustrates a general flow diagram for a method of forming a composite aspect in which an SOC layer is provided as an adhesion-promoting layer.

As shown in FIG. 6, for instance, certain aspects of the present disclosure in which the SOC layer is sandwiched between the polymeric substrate and a traditional OBL can include a step of providing one or more polymeric substrates 200 followed by depositing an adhesion-promoting layer comprising a SOC 250 onto at least one surface of the polymeric substrate. The SOC coated polymeric substrate can then be subjected to an OBL deposition step 275 in which a traditional OBL is deposited over the top of the SOC layer such that the SOC layer is sandwiched between the OBL and the polymeric substrate to provide a composite according to certain aspects of the present disclosure. Although not shown in FIG. 7, the polymeric substrates can be pre-cleaned by traditional physical or chemical methods and/or plasma pretreated prior to depositing an SOC layer onto the polymeric substrate.

As noted previously, the SOC coatings/layers are created by atmospheric plasma deposition. One of the benefits of using atmospheric plasma deposition is that the relatively large production of chemically reactive species, such as atomic oxygen, enables the precursor to be mixed downstream in the plasma afterglow where it can react with the reactive neutrals from the plasma to produce a coating on the substrate. Atmospheric plasma deposition beneficially generates much greater reactive species concentrations than more traditional deposition techniques and can be used in a remote or downstream mode. One suitable atmospheric plasma deposition system suitable for deposited an SOC coating onto a polymeric matrix substrate is ATOMFLO™ Model 400 with Precursor Delivery System from Surfx® Technologies LLC (USA).

Chemical precursor materials for creation of SOC layers in accordance with aspects of the present disclosure can generally comprise silanes, organosilanes, or combination thereof. A few exemplary chemical precursors suitable for certain aspects include octamethylcyclotetrasiloxane (OMCTS), tetramethylcyclotetrasiloxane (TMCTS), hexamethyldisiloxane (HMDSO), 1,2-bis(triethoxysilyl)ethane (BTESE), tetraethyl orthosilicate (TEOS), hexamethyl di silazane (HMDSN), tetramethyldi si oxane (TMDSO), or combinations thereof.

As generally understood, atmospheric plasma deposition has several parameters that can be adjusted in unison or independently of each other to tailor the resulting SOC coating for a desired application. The following operating parameters and associated ranges for each are merely exemplary of the operating conditions that can be employed to create SOC layers according to aspects of the present disclosure. The height of the plasma applicator head from the substrate being coated can be adjusted as desired, for example, from about 1 mm to 1 cm (e.g., 2-7 mm, 3-6 mm). The helium or argon (as the primary gas) flow rate can be varied from about 20 to 50 liters per minute (LPM) (e.g., 20-40, 25-35 LPM). The plasma power can be varied from about 80 W to 180 W (e.g, 100-150 W, 120-150 W). Oxygen gas flow can range, for example, from 0.1 to 1 LPM. The bubbler flow rate of the inert gas (e.g., helium) can range from about 0.1 to 2 LPM. The dilution flow rate of inert gas can range from about 0.5 to 5.0 LPM. The temperature of the chemical precursor can vary from room temperature up to the boiling point of the particular chemical being utilized as the chemical precursor. The plasma applicator head is typically attached to a robotic arm that has been programmed to apply the SOC coating onto a given space of the substrate. The speed at which the robotic arm moves can be varied as well. For instance, the speed at which the robotic arm moves can range from 10-100 mm/s.

FIG. 7A provides a general schematic of an atmospheric deposition device in accordance with certain aspects of the present disclosure. The atmospheric-plasma deposition device 50 includes an outer electrode 52 which is electrically grounded and an inner electrode 54 to which an external voltage is applied. The external voltage can be supplied by a high-frequency, high-voltage generator 57. In certain aspects, the generator 57 can supply the inner electrode 54 with a voltage in the order of, for example, 5 to 30 kV and the frequency of the voltage can range, for example, from 10 to 20 kHz. The atmospheric plasma deposition device 50 includes a plasma gas/working gas inlet stream 56 entering a first end of the device 50. Preferably, the plasma gas/working gas inlet stream 56 comprises helium gas, oxygen gas, or a mixture thereof. A plasma discharge 58 is generally located at an end of the device 50 opposite to the plasma gas/working gas inlet stream 56. When operational, a plasma stream 60 exits the plasma discharge 58 of the device 50.

One or more chemical precursors 62, such as those discussed in the present specification, can be introduced into the plasma steam 60 via precursor inlets 64. As shown in FIG. 7A, an SOC layer 15 can be deposited onto the surface of a polymeric substrate 10.

Although FIG. 7A illustrates a device 50 providing a single discharge steam (e.g., plasma discharge 58 in FIG. 7A), certain preferred aspects utilize a device comprising a showerhead-type configuration in which multiple plasma discharges are provided. FIG. 7B, for example, illustrates a device comprising a showerhead-type configuration in which multiple plasma discharges are provided. As shown in FIG. 7B, an atmospheric-plasma deposition device 50 can comprise a showerhead-type discharge head 152 including multiple discharge orifices 158. The power supply 157 and the chemical precursors 162 can be connected to the top of the device 50. In such aspects, the chemical precursors can be delivered inside the head to the plasma and the afterglow region 160 is where the chemical reactions and film deposition occur. One commercially available device including a showerhead-type configuration in which multiple plasma discharges are provided includes ATOMFLO™ Model 400 from Surfx® Technologies LLC (USA).

EXAMPLES

A total of eight panels (polyimide composites: AFR-PE-4 polyimide resin with T650 carbon fibers) had a SOC layer, ranging from about 200-500 nm thick, deposited thereon by atmospheric plasma deposition utilizing ATOMFLO™ Model 400 with Precursor Delivery System from Surfx® Technologies LLC (USA) to form the SOC layers in each of these examples. The chemical precursors utilized were TMCTS and OMCTS. Prior to deposition of the SOC layer onto the polyimide substrate, a pretreatment step was conducted. In particular, the polyimide substrate was pretreated at a 50% power rating for 4 minutes March Plasmod GCM-200 with air as the plasma gas. A ninth panel (FIG. 8I) was prepared and tested to provide a comparison to the eight panels having a SOC deposited thereon by atmospheric plasma deposition. The ninth panel was provided coated with a vacuum CVD film.

The operating variables that were modified from run to run, as well as respective values, are summarized in Table 1 below. Table 2 provides a summary of the operating parameters of atmospheric plasma deposition that were held as fixed conditions during all runs. It should be noted, however, that the operating parameters that were selected to be fixed conditions among the eight run need not necessarily be fixed or set at these particular values. For instance, the height between the plasma-deposition source and the closest surface of the polyimide substrate can readily be varied from the 5-mm height employed in the exemplary runs discussed herein. For instance, the height of the deposition source above the substrate can be varied from 1 mm to 1 cm.

Table 3 provides a quick summary of the times used to coat a SOC layer onto a 100 mm×138.5 mm polyimide substrate. It should be noted, however, that the deposition rates and/or density of the resulting SOC layer can be tailored by adjusting one or more of the operating parameters of the atmospheric plasma deposition.

TABLE 1

Variation of Operating Parameters in Trials
Using Atmospheric Plasma Deposition

| Run No. | Power/ O2(Lpm) | Bubbler (Lpm) | Speed (mm/sec) | Precursor | Dilution (Lpm) |
|---|---|---|---|---|---|
| 1 | 150/0.45 | 1.5 | 50 | OMCTS | 1.5 |
| 2 | 150/0.45 | 1.5 | 10 | OMCTS | 0.5 |
| 3 | 150/0.45 | 1 | 50 | TMCTS | 1.5 |
| 4 | 150/0.45 | 1 | 10 | TMCTS | 0.5 |
| 5 | 120/0.2 | 1.5 | 50 | TMCTS | 0.5 |
| 6 | 120/0.2 | 1.5 | 10 | TMCTS | 1.5 |
| 7 | 120/0.2 | 1 | 50 | OMCTS | 0.5 |
| 8 | 120/0.2 | 1 | 10 | OMCTS | 1.5 |

TABLE 2

Fixed Conditions used in Atmospheric Deposition Trials

| Run No. | Height (mm) | Helium flow rate (Lpm) | Temperature of Precursor |
|---|---|---|---|
| 1 | 5 | 30 | 30 |
| 2 | 5 | 30 | 30 |
| 3 | 5 | 30 | 30 |
| 4 | 5 | 30 | 30 |
| 5 | 5 | 30 | 30 |
| 6 | 5 | 30 | 30 |
| 7 | 5 | 30 | 30 |
| 8 | 5 | 30 | 30 |

TABLE 3

Time for coating a polyimide composite of 100 mm × 138.5 mm

| Run No. | 1 | 2 | 3 | 4 | 5 | 6 | 7 | 8 |
|---|---|---|---|---|---|---|---|---|
| Time (min) | 94.5 | 94.5 | 57.3 | 57.3 | 57.3 | 57.3 | 94.5 | 94.5 |

Each of the samples (e.g., polyimide composite coated with an SOC layer) was subjected to testing for oxygen-barrier functionality at 450° F. for about 7,752 hours with weight loss data obtained after about 3,432 hours of exposure. These tests were conducted to illustrate the ability of the respective SOC coatings to stay attached to the polyimide substrate and the ability to prevent weight loss due to oxidation. As discussed above, the SOC layers were deposited using OMCTS and TMCTS precursors with atmospheric plasma and the "CVD" sample was deposited with OMCTS in a vacuum chamber. The results of this additional testing are summarized in Table 4.

TABLE 4

High temperature testing of SOC-coated polyimide
composites conducted at 450° F. for 3,432 hours.

| Sample | Initial Weight, g | Final Weight, g | Weight Loss, g | Weight Loss, % |
|---|---|---|---|---|
| C1 | 57.016 | 56.411 | −0.605 | −1.07 |
| C2 | 56.446 | 55.660 | −0.786 | −1.41 |
| C3 | 56.738 | 56.319 | −0.419 | −0.74 |
| C4 | 56.643 | 56.336 | −0.307 | −0.54 |
| C5 | 54.025 | 56.366 | −0.659 | −1.17 |
| C6 | 56.664 | 55.829 | −0.835 | −1.50 |
| C7 | 56.839 | 55.809 | −1.03 | −1.85 |
| C8 | 56.748 | 55.307 | −1.441 | −2.61 |
| CVD | 56.790 | 56.233 | −0.557 | −0.99 |

Figure 8A:
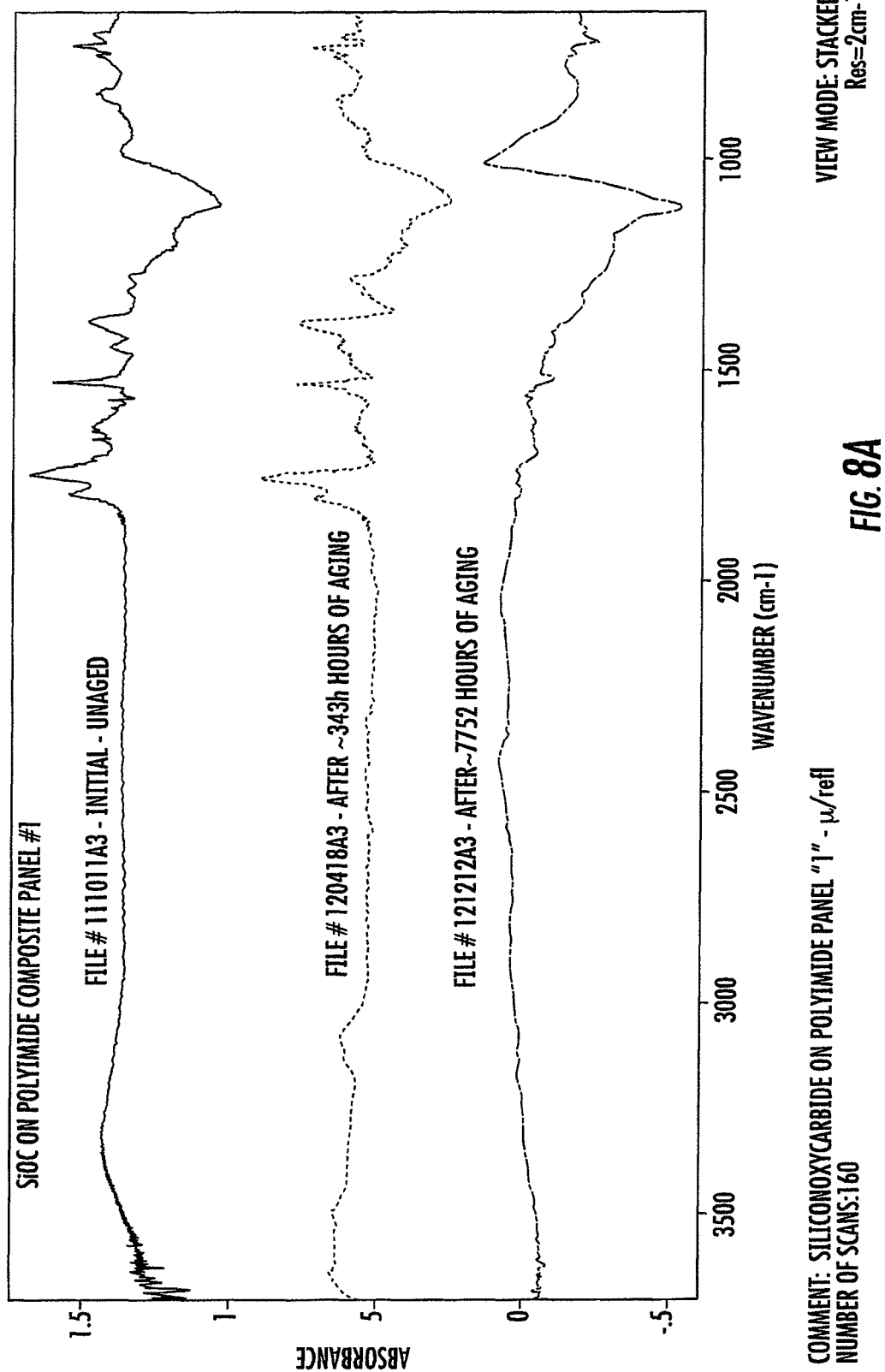
Figure 8B:
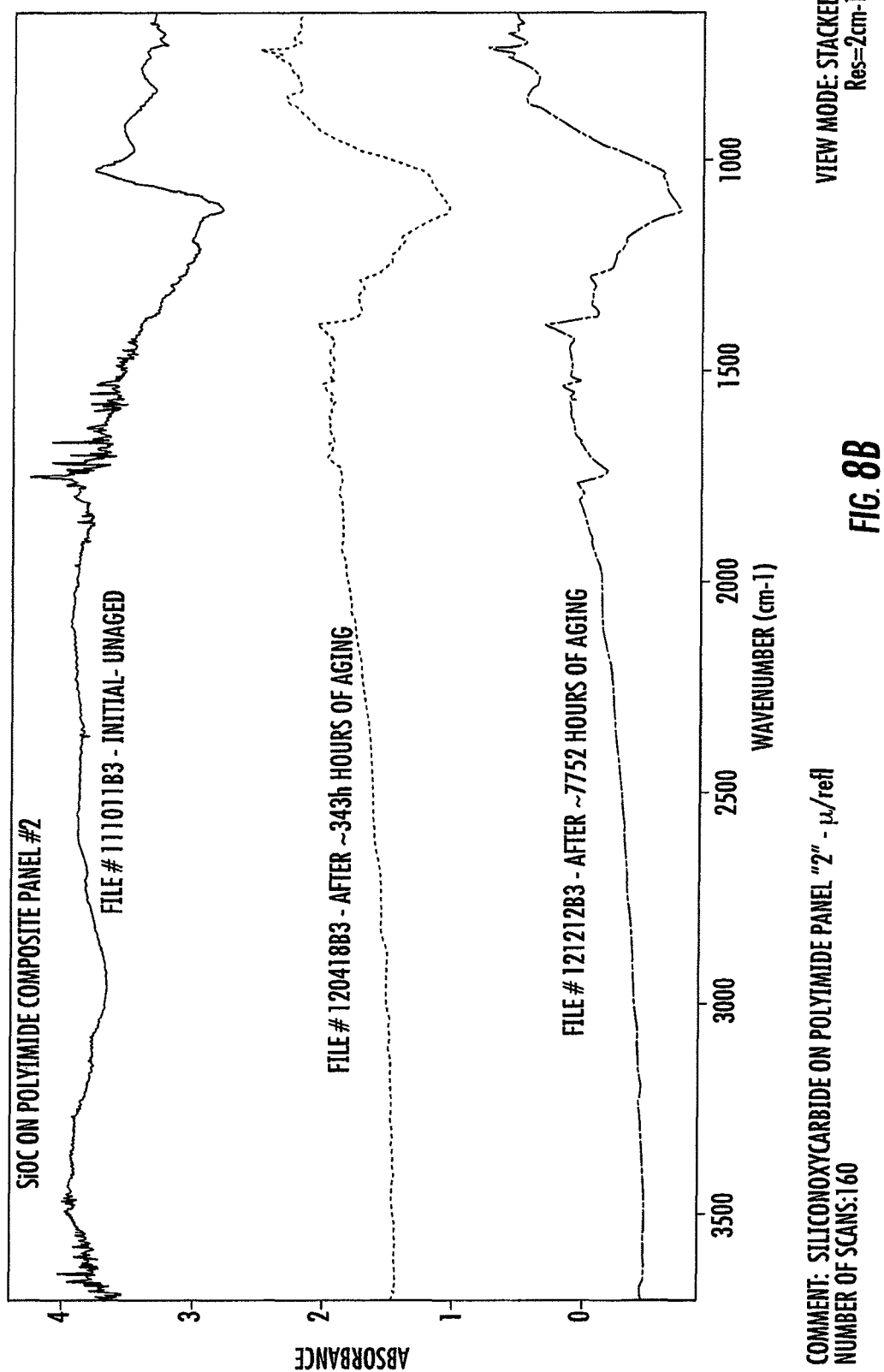
Figure 8C:
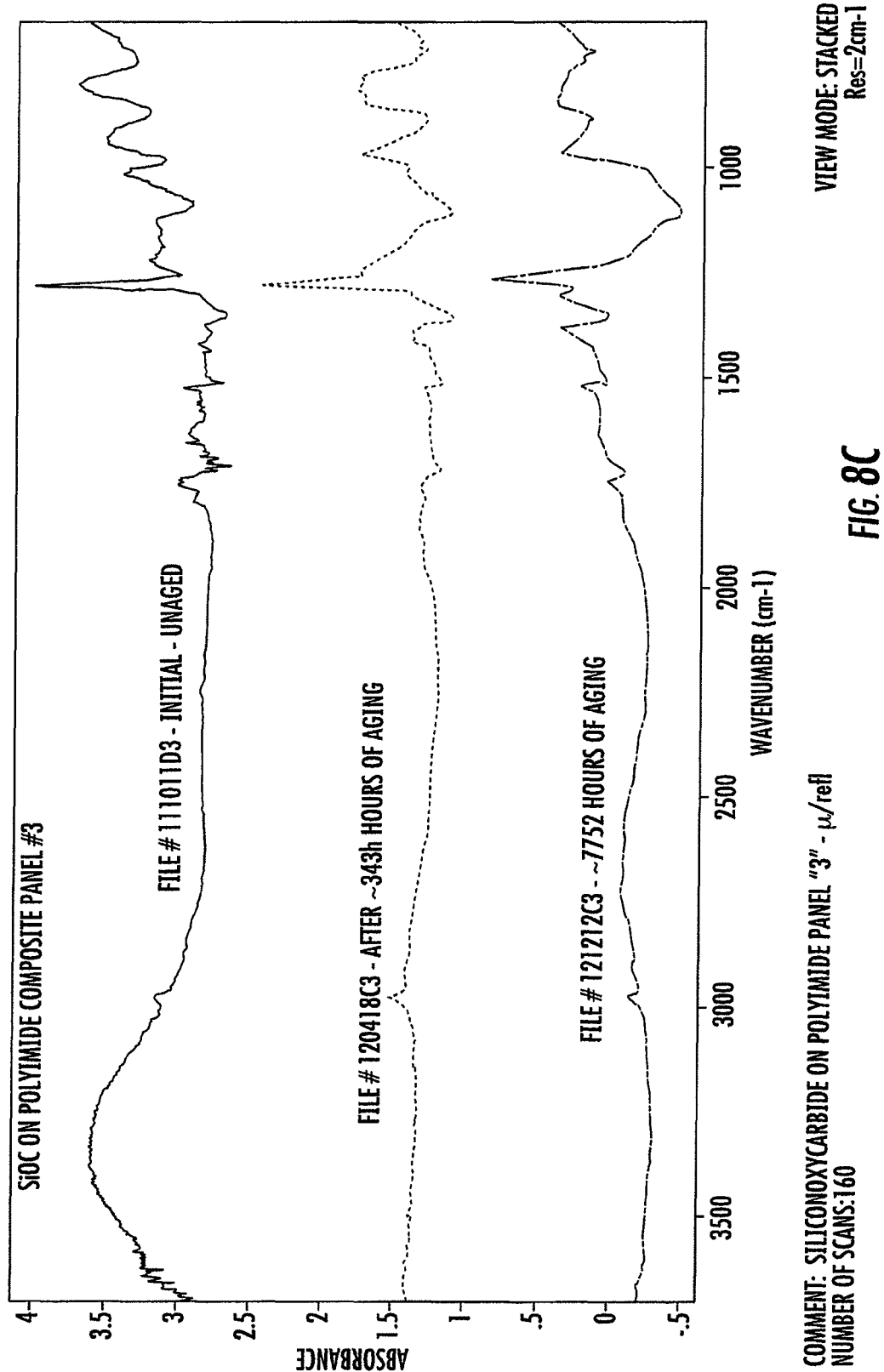
Figure 8D:
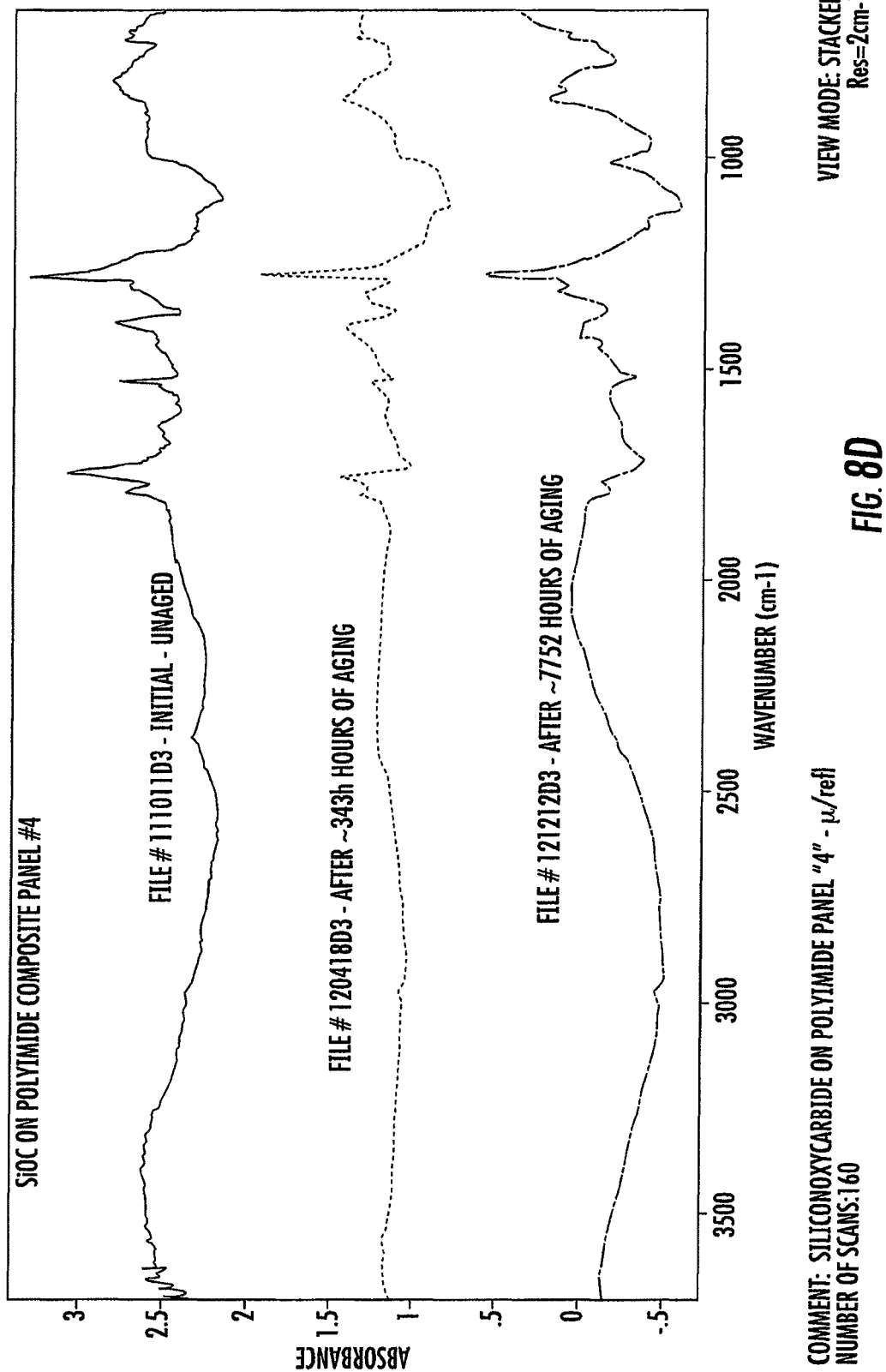
Figure 8E:
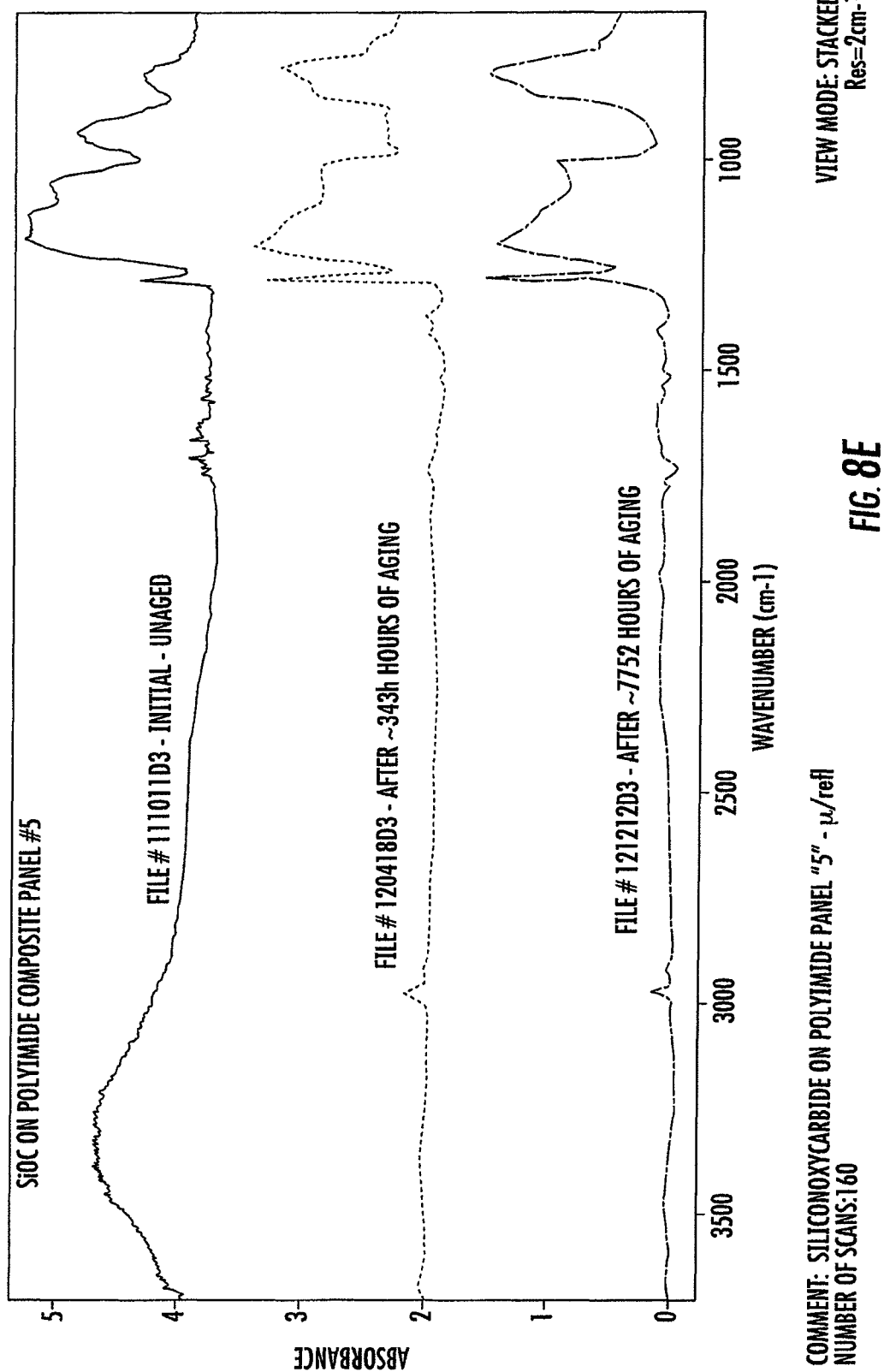
Figure 8F:
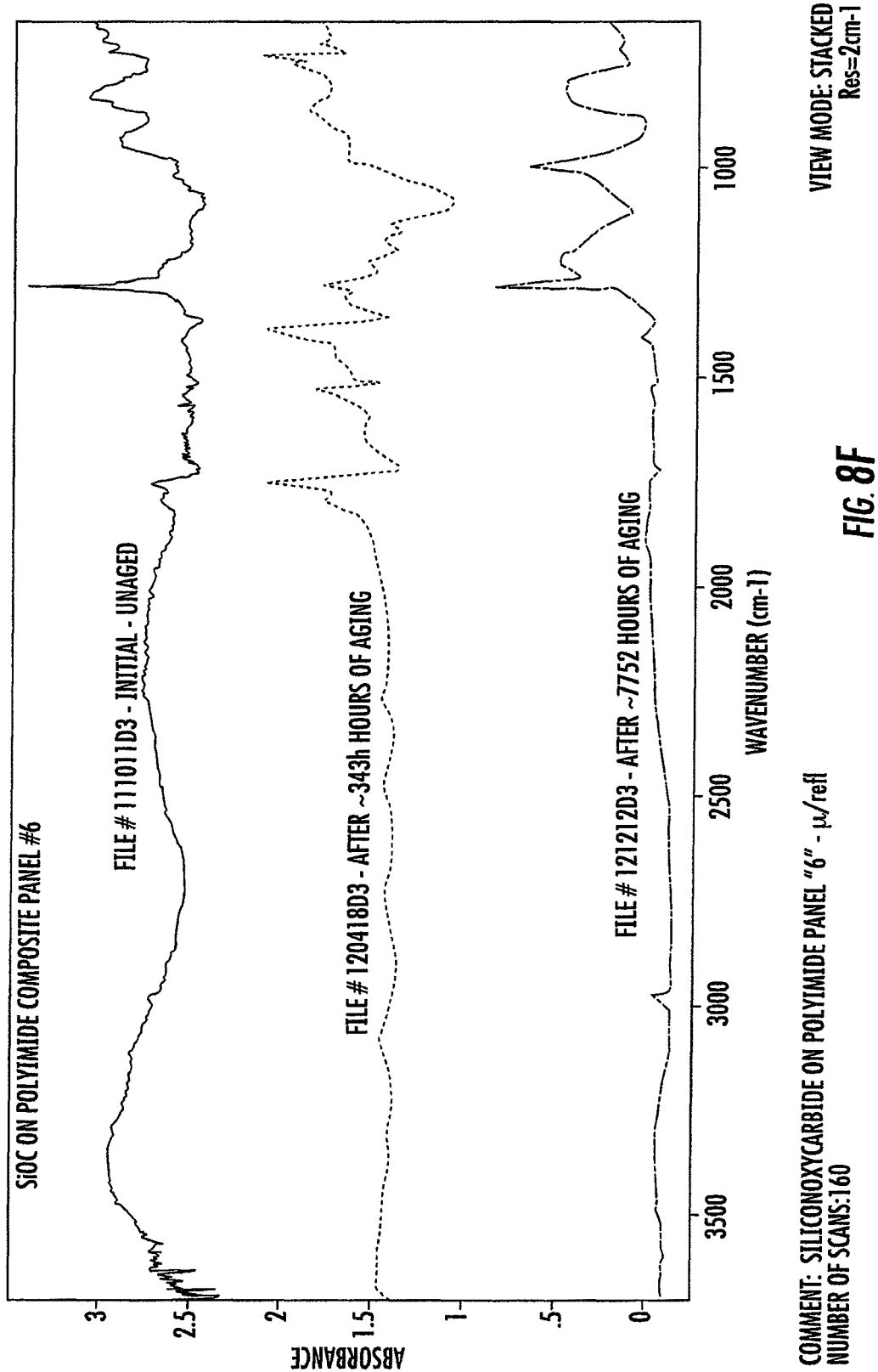
Figure 8G:
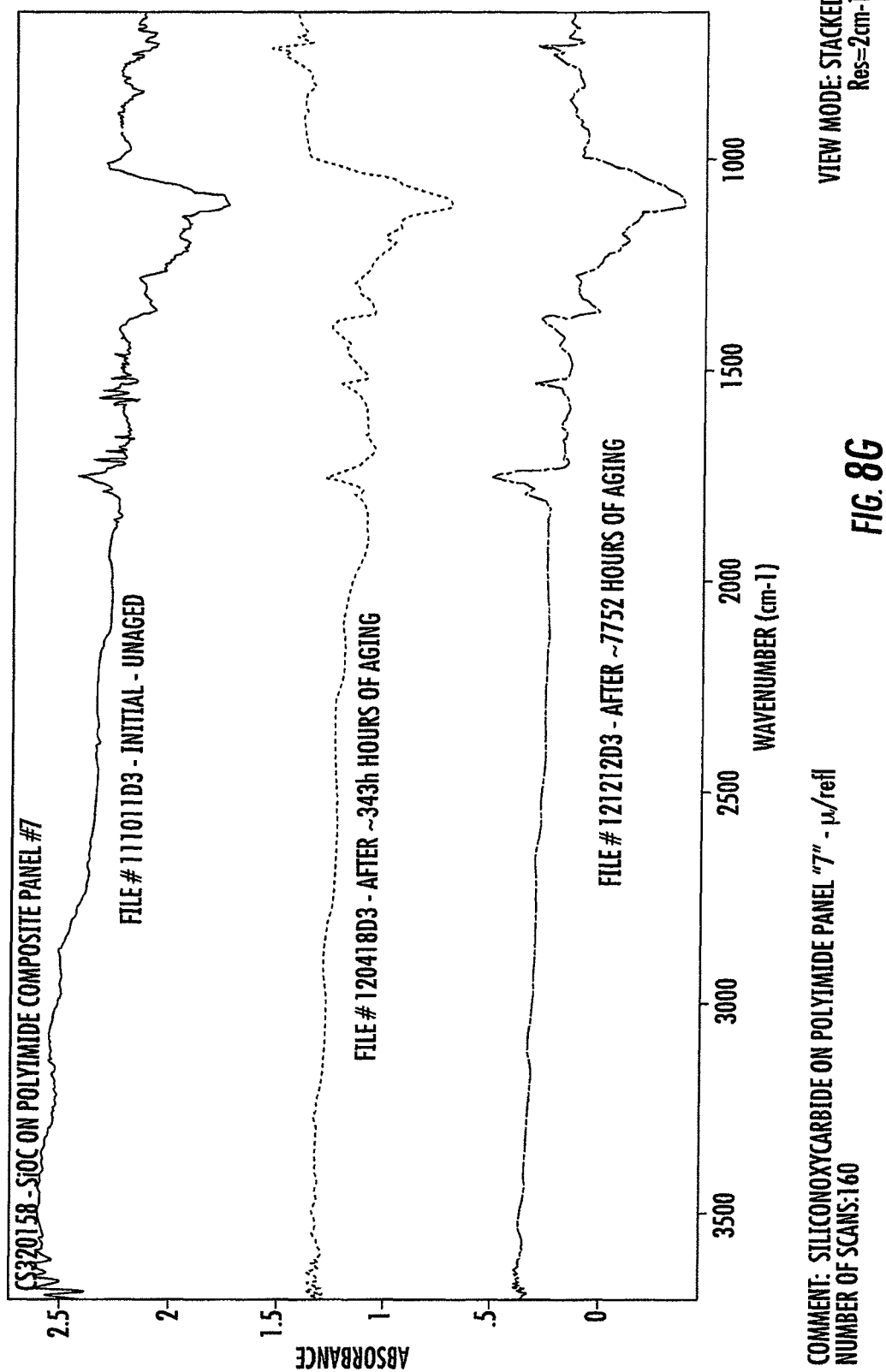
Figure 8H:
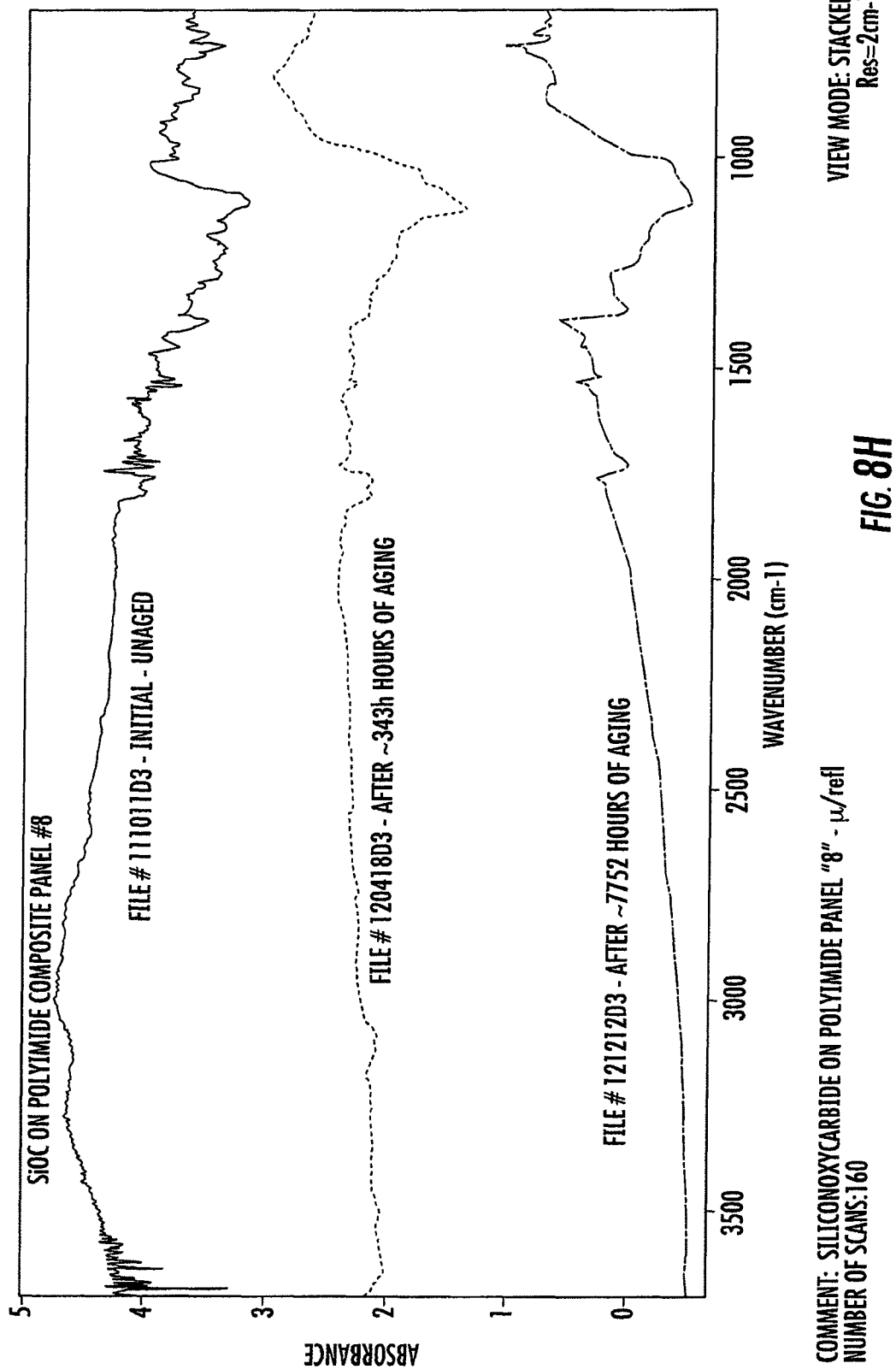
Figure 8I:
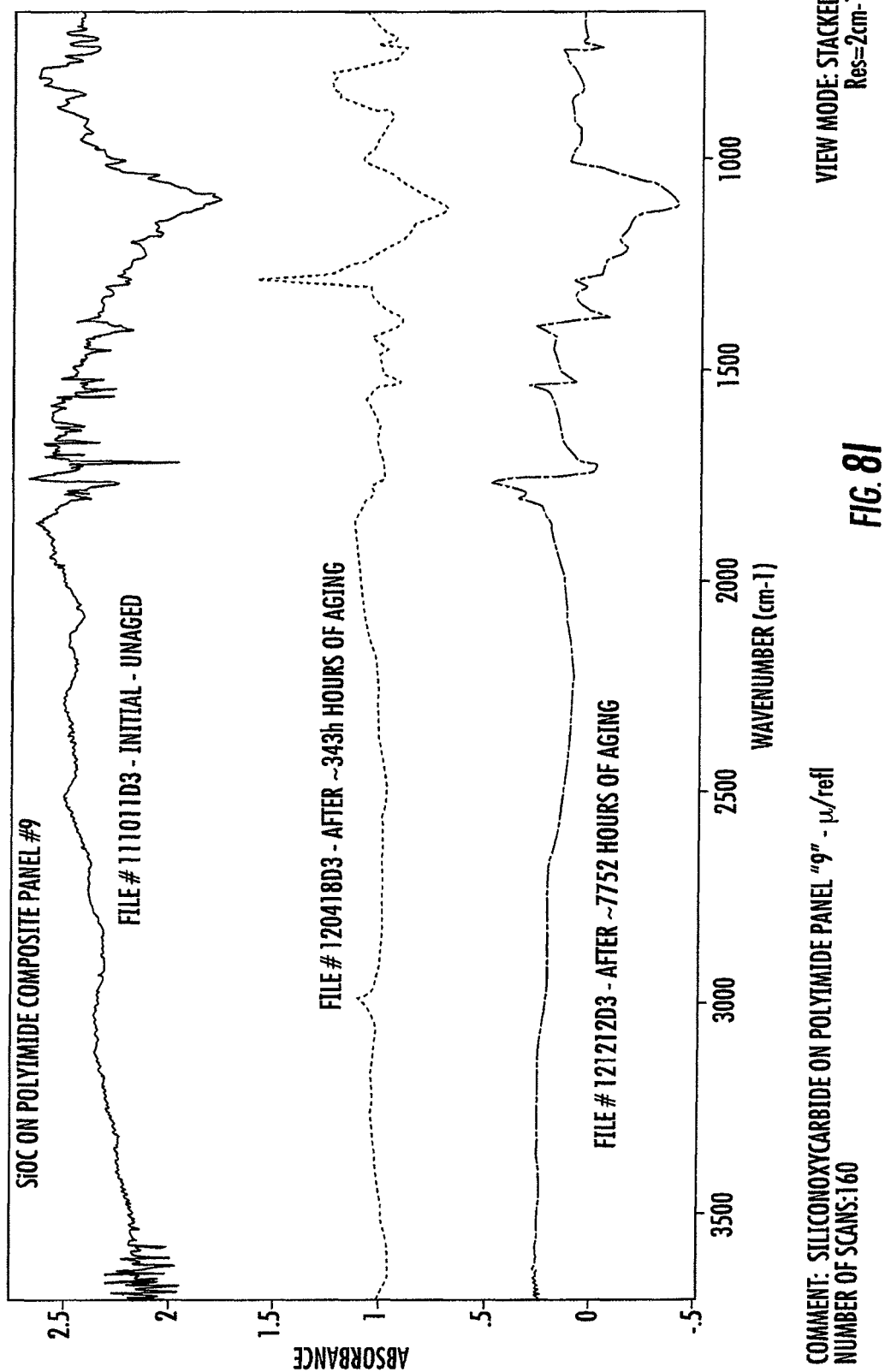

Additional testing comprising Fourier transform infrared spectroscopy (FTIR) was conducted on the SOC layers at the following three points of time: (1) prior to being subjected to aging process as discussed above; (2) after about 3,432 hours of being subjected to aging; and (3) after about 7,752 hours of being subjected to aging. The respective FTIR spectra for each sample are provided in FIGS. 8A-8I. Particularly preferred aspects according to certain aspects exhibit stability in the FTIR spectra over the time of aging/exposure. For a given panel, that is, a comparison of the FTIR spectrum representative of the unaged (e.g., no aging) panel and subsequent FTIR spectra representative of aged panel should not change significantly. The SOC coatings can be considered stable when only minor (or preferably no) changes in the FTIR spectra from unaged to aged are compared. In such instances, the SOC layers can be considered stable and not oxidizing or thermally degrading during the test period. To the contrary, FTIR spectra that show large differences from the unaged to the aged are not particularly desirable as they are chemically changing as they age. Stated differently, changes in FTIR spectra after different amounts of aging indicate that the chemical composition of the surface is changing due to reaction with oxygen and other molecules. The FTIR spectra for the aspects associated with FIGS. 8C, 8D, and 8G show the least change in chemical composition after exposure to elevated temperature.

Many modifications and other aspects of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific aspects disclosed and that modifications and other aspects are intended to be included within the scope of the appended claims. Although specific terms are employed herein, they are used in a generic and descriptive sense only and not for purposes of limitation.

That which is claimed:

1. A composite, comprising: a substrate comprising a fiber reinforced polymeric matrix, and a barrier coating comprising a silicon-oxy-carbide (SOC) layer having a thickness from about 10 to about 400 nm, the SOC layer attached directly to at least one surface of the substrate, wherein the fibers comprise carbon or graphite fibers, and the polymeric matrix is selected from a polyimide, an epoxy, bismaleimide, and a cyanate ester.

2. The composite of claim 1, wherein the SOC layer is formed by atmospheric plasma deposition.

3. The composite of claim 2, wherein the SOC layer includes a carbon content ranging from about 3 weight % to about 50 weight percent, based on the total weight of the SOC layer.

4. The composite of claim 2, wherein the SOC layer includes a silicon content ranging from about 3 weight % to about 50 weight percent, based on the total weight of the SOC layer.

5. The composite of claim 2, wherein the SOC layer includes an oxygen content ranging from about 3 weight % to about 50 weight percent, based on the total weight of the SOC layer.

6. The composite of claim 2, wherein the SOC layer reduces oxygen diffusion into the substrate.

7. The composite of claim 6, wherein said composite comprises a thermo-oxidative stability (TOS) of less than about 5.0% weight loss relative to a composite comprising an identical substrate and being devoid of the SOC layer.

8. The composite of claim 6, wherein said composite comprises a thermo-oxidative stability (TOS) of less than about 2.0% weight loss relative to a composite comprising an identical and being devoid of the SOC layer.

9. The composite of claim 2, wherein the polymeric matrix comprises a polyimide matrix.

10. The composite of claim 1, wherein the fibers comprise carbon fibers.

11. A method of forming the composite of claim 1, comprising: depositing the barrier coating comprising the silicon-oxy-carbide (SOC) layer having a thickness from about 10 to about 900 nm onto the at least one surface of the substrate.

12. The method of claim 11, wherein the depositing step comprises the deposition of the SOC layer via atmospheric plasma deposition (APDP).

13. The method of claim 12, wherein the APDP comprises the use of a chemical precursor of the SOC layer comprising a silane, organosilane, or combination thereof.

14. The method of claim 12, wherein the APDP comprises the use of a chemical precursor of the SOC layer comprising tetramethylcyclotetrasiloxane, octamethylcyclotetrasiloxane, or a combination thereof.

15. The method of claim 12, wherein the SOC layer inhibits the diffusion of oxygen into the substrate.

16. The method of claim 15, wherein said composite comprises a thermo-oxidative stability (TOS) of less than about 2.0% weight loss relative to a composite comprising the same substrate and being devoid of the SOC layer.

* * * * *